United States Patent [19]

Comer et al.

[11] 4,109,215

[45] Aug. 22, 1978

[54] DUAL MODE OUTPUT AMPLIFIER FOR A SAMPLE AND HOLD CIRCUIT

[75] Inventors: Donald Thomas Comer, Los Gatos; Daniel Joseph Dooley, Saratoga; George Erdi, Palo Alto; Paul Raymond Henneuse, San Jose, all of Calif.

[73] Assignee: Precision Monolithics, Inc., Santa Clara, Calif.

[21] Appl. No.: 791,272

[22] Filed: Apr. 27, 1977

[51] Int. Cl.² .............................................. H03F 3/45
[52] U.S. Cl. ................................... 330/254; 307/353; 328/151; 330/257
[58] Field of Search ................ 330/252, 254, 257, 261; 307/352, 353, DIG. 3; 328/151

[56] References Cited
U.S. PATENT DOCUMENTS 3,492,498  1/1970  Bartz et al. ........................... 307/353
3,643,110  2/1972  Thompson ........................ 328/151 X

OTHER PUBLICATIONS

Maillet, "Sample and Hold Circuit", *IBM Technical Disclosure Bulletin*, vol. 19, No. 2, Jul. 1976, pp. 536–537.

Primary Examiner—James B. Mullins
Attorney, Agent, or Firm—Paul H. Ware; William G. Becker

[57] ABSTRACT

There is disclosed a dual mode amplifier for use as the output amplifier of a sample and hold circuit. The dual mode amplifier described by the invention is controlled by a sample and hold gate. In one of its modes the characteristics of the amplifier are optimized for best slew rate and transient performance, while in the other mode the amplifier characteristics are optimized for settling time.

10 Claims, 9 Drawing Figures

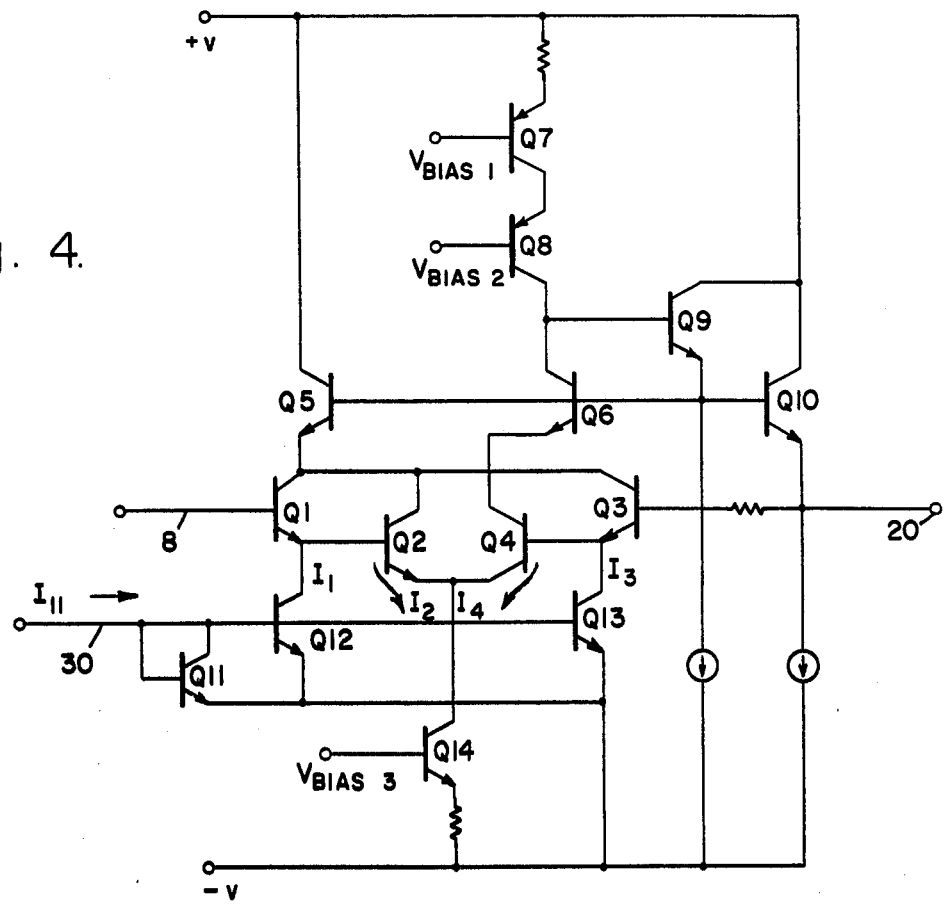
Fig. 4.
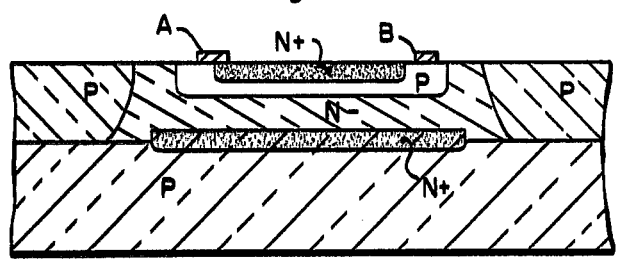
Fig. 6.
Fig. 8.
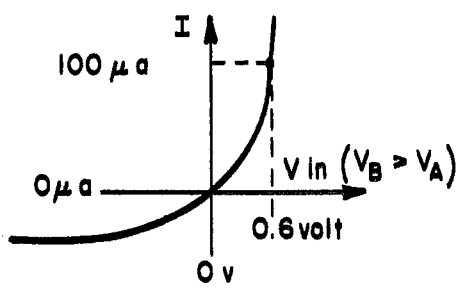
Fig. 7.

DUAL MODE OUTPUT AMPLIFIER FOR A SAMPLE AND HOLD CIRCUIT

BACKGROUND OF THE INVENTION

1. Field of the Invention

This invention relates generally to sample and hold circuits and more particularly to output amplifiers for such sample and hold circuits.

2. Description of the Prior Art

In one prior art type of sample and hold circuit, a first unity gain buffer amplifier is employed to transmit an input signal to a sample holding device such as, for instance, a capacitor, while a second unity gain amplifier is used to transmit the signal from the holding device to the output. The first amplifier is separated from the capacitor by a switch which is closed by an externally originated control signal during sampling periods allowing the input signal to charge the capacitor to the sample voltage level, and opened by the control signal during other periods decoupling the capacitor from the first amplifier and enabling it to hold the sample voltage level until the next sample is obtained. In order for the second amplifier to accurately transmit the sample voltage level to the output during relatively long intervals, it is necessary that it possess a very low input bias current so that it does not cause significant loading or loss of charge of the sample capacitor during the hold interval. On the other hand, it is necessary that the second amplifier be capable of responding at a relatively fast rate during the sample interval so that a given sample may be acquired as quickly as possible. The ability of an amplifier to respond quickly to large signal differentials is normally measured by its slew rate. Thus, ideal qualities for the output amplifier of a conventional prior art sample and hold circuit are (1) a low input bias current, (2) a high slew rate. A third quality which is important in special types of sample and hold circuits is the small signal transient response margin, or phase margin. This quality is especially important in sample and hold circuit arrangements which employ minor loop feedback to enhance the charging rate of the sample capacitor. In this case, as with any arrangement that uses a minor feedback loop in which the output amplifier is included, the gain phase characteristics of the output amplifier become a major factor in determining the stability and transient characteristics of the minor feedback loop. In general, large phase shifts in the output amplifier can give rise to an unstable loop which results in either oscillations or long settling times, while the minor loop is active. The problem associated with the design of an output amplifier suitable for use in a sample and hold circuit is that the requirements are conflicting. The requirement for low input bias current is conflicting with the requirement for high slew rate and with good transient performance. In prior art the problem has been approached by compromising the tradeoffs between high DC impedance and transient performance.

It would thus be a great advantage to the art to provide an amplifier exhibiting both a low input bias current and a high slew rate with good transient performance.

SUMMARY OF THE INVENTION

It is an object of the present invention to provide an amplifier exhibiting both the characteristics of low input bias current and high transient response.

A further object of the present invention is to provide a sample and hold amplifier with two distinct operating modes.

It is another object of the present invention to provide a dual mode sample and hold amplifier which is controlled as to mode by a sample/hold gate.

It is yet another object of the present invention to provide such a sample and hold output amplifier that is relatively simple and inexpensive.

BRIEF DESCRIPTION OF THE DRAWINGS

Further advantages and features of the invention will be apparent to those skilled in the art from the ensuing detailed description thereof, taken together with the accompanying drawings, in which:

FIG. 4 is a schematic diagram of an output amplifier which incorporates one of the principals of the present invention.

FIG. 6 is a cross section of an integrated circuit fabrication of a pinch resistor.

FIG. 7 is a schematic symbol for a pinch resistor.

FIG. 8 is a voltage-current response characteristic curve for a pinch resistor.

DETAILED DESCRIPTION

Although specific embodiments of the invention will now be described with reference to the drawings, it should be understood that such embodiments are by way of example only, and merely illustrative of but a small number of the many possible specific embodiments which can represent applications of the principals of the invention. Various changes and modifications obvious to one skilled in the art to which the invention pertains are deemed to be within the spirit, scope and contemplation of the invention as further defined in the appended claims.

Figure 1:
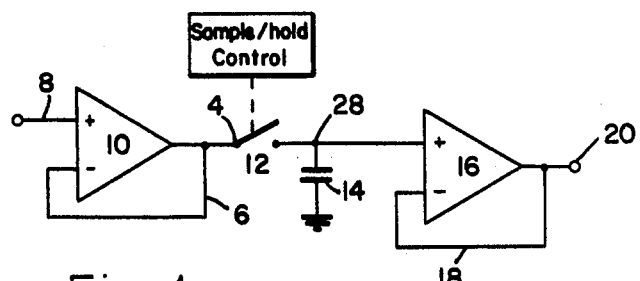
FIG. 1 is a block diagram of a prior art sample and hold circuit.

FIG. 1 illustrates a prior art sample and hold circuit. Input signal is received by unity gain buffer amplifier 10 on a lead 8. Feedback signal is applied to the negative input of amplifier 10 on lead 6. Signal output from amplifier 10 is applied to hold capacitor 14 on lead 28 by means of switch 12 which receives output signal from amplifier 10 on a lead 4. The signal appearing on hold capacitor 14 is applied to unity gain output amplifier 16 on lead 28. Feedback signal is applied to the negative input of amplifier 16 on lead 18. Unity gain amplifier 16 transmits the signal received from holding capacitor 14 to the output on lead 20.

Thus a first unity gain buffer amplifier 10 is employed to transmit an input signal to a sample holding capacitor 14, while a second unity gain amplifier 16 transmits the signal from the holding capacitor 14 to the output. Amplifier 10 is separated from capacitor 14 by switch 12 which is closed by an externally originated control signal during sample periods, thus allowing the input signal to charge capacitor 14 to the sample voltage level. Switch 12 is opened by the control signal during other periods, thus decoupling capacitor 14 from amplifier 10 and enabling it to hold the sample voltage level until the next sample is obtained.

It is apparent that in order for amplifier 16 to accurately transmit the sample voltage level to the output during relatively long intervals, it is necessary that it possess a very low input bias current. This is necessary so as not to cause significant loading or loss of charge of capacitor 14 during the hold intervals or some other non-sampling interval. It is also necessary for amplifier 16 to possess a fast transient response during the sample interval so as to acquire a given sample in a minimum time interval. As has been indicated previously, these requirements are incompatible.

Figure 2:
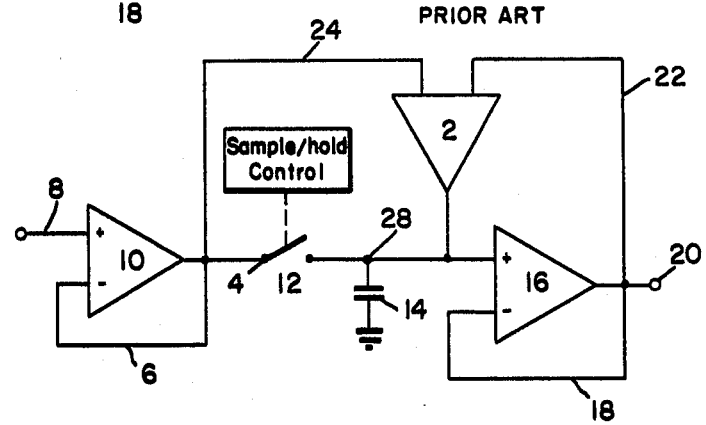
FIG. 2 is a block diagram of a sample and hold circuit which employs an additional feedback loop to supplement the charging current to the sample capacitor.

Referring now to FIG. 2, a third quality, important in special types of sample and hold circuits, is explained. The small-signal transient response of the output amplifier is the important quality to which reference is made. This response characteristic can be measured in terms of gain margin or phase margin and is especially important in sample and hold circuit arrangements which employ minor loop feedback to enhance the charging rate of the sample capacitor.

Input signal is received by amplifier 10 on lead 8. Feedback signal is applied to the negative input of amplifier 10 on lead 6. Signal output from signal amplifier 10 is applied to hold capacitor 14 on lead 28 by means of switch 12 which receives output signal from output amplifier 10 on a lead 4. The signal appearing on hold capacitor 14 is applied to output amplifier 16 on lead 28. Feedback signal is applied to the negative input of amplifier 16 on lead 18. Output signal from amplifier 16 is applied to an input of charging boost amplifier 2 on lead 22. As before, switch 12 is closed by an externally originated control signal during sampling periods thus allowing the input signal to charge capacitor 14 to the sample voltage level. Switch 12 is opened by the same control signal during other periods, thus decoupling capacitor 14 from amplifier 10 and enabling it to hold the sample voltage level until the next sample is obtained. Output signal from amplifier 10 is also applied to another input of amplifier 2 on lead 24. The output signal from amplifier 2 is applied to the positive input of amplifier 16. Output signal from amplifier 16 is furnished on lead 20. It is significant that this arrangement uses a minor feedback loop. In any arrangement using a minor feedback loop which includes the output amplifier, the gain-phase characteristics of that output amplifier become a major factor in determining the stability and transient characteristics of the minor feedback loop. In general, large phase shifts in the output amplifier can give rise to an unstable loop which results in either oscillations or long settling times while the minor loop is active. The prior art thus demonstrates that the requirement for low input bias current is conflicting with the requirement for high slew rate and with good transient performance.

Figure 3:
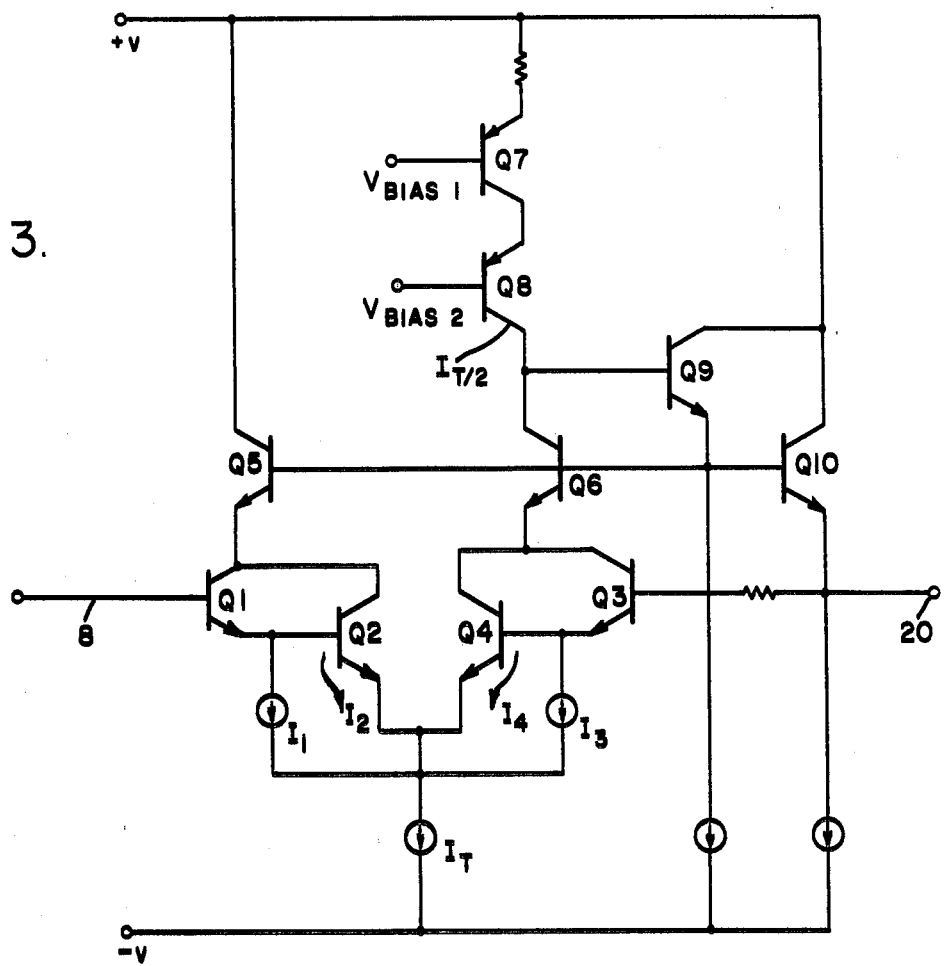
FIG. 3 is the schematic diagram representative of a prior art integrated circuit output amplifier.

Referring now to FIG. 3, the circuit there depicted is typical of prior art integrated circuit implementations of the output amplifier for a sample and hold circuit. The circuit is in essence a high gain differential amplifier connected as a voltage follower by virtue of unity feedback. High input impedance is achieved by the use of Darlington-connected input transistors (Q1 – Q2 and Q3 – Q4) which preferably would be super-beta NPN devices. The collector outputs of each side of the Darlington-connected input stage connects through a common base stage (Q5 and Q6) to active load stages Q7 and Q8. The single ended output of the differential stage is taken at Q8 collector and applied to the Darlington-connected emitter follower Q9 and Q10 to the circuit outputs.

Positive and negative DC voltages are supplied as +V and −V by means of a suitable power supply (not shown). Appropriate bias voltages, V bias 1 and V bias 2 are applied to the bases of Q7 and Q8, respectively. Input signal is received on the base of Q1 from a lead 8 and output signal is furnished from the emitter of Q10 on lead 20.

The low input bias current of this circuit, determined by the input bias current of Q1, may be calculated as:

$$I_{B1} = \frac{I_1}{\beta_1 + 1} + \frac{I_2}{(\beta_1 + 1)(\beta_2 + 1)}$$

where $I_1$ is the Quiescent Emitter Current for Q1 and $I_2$ is the emitter-bias current for Q2. Values of the above parameters in a typical design might be:

$\beta_1 = \beta_2 = 1000$
$I_2 = 100\mu a$
$I_1 = 1\mu a$

This results in a value $I_{B1} = 1.1$ nanoamperes. The slew rate of this amplifier is typically dominated by the capacitances at the emitters of Q1 and Q3. For large negative going input signals the emitter capacitance will hold the emitter positive as the base goes negative, causing the emitter follower devices Q1 and Q3 to cut-off. Thus, the discharge of the emitter node is primarily by the bias current $I_1$. The slew rate for negative going signals is:

$$\text{slew rate} = (I_1/C_E)$$

where $C_E$ is the total capacitance on the emitter node. For $I_1 = 1\mu a$ a typical capacitance of 3pf will limit the slew rate to 0.33 volt/microseconds, even though the other components of the amplifier will typically allow slew rates as high as 5 to 10 volts/microsecond. Prior attempts have been made to control the current $I_1$ in such a manner that it increases when there are large imbalances between the input and output.

Referring now to FIG. 4, the circuit there depicted solves the problem of the tradeoff between slew rate and input bias current by taking advantage of the fact that in a sample and hold application the output amplifier need not exhibit a low input bias current during the sample mode and also need not exhibit a fast slew rate in the hold mode.

Positive and negative DC voltages are supplied as +V and −V by means of a suitable power supply (not shown). Appropriate bias voltages V bias 1, V bias 2, and V bias 3 are applied to the bases of Q7, Q8 and Q14, respectively. Input signal is received on the base of Q1 from a lead 8 and output signal is furnished from the emitter of Q10 on lead 20. In the circuit of FIG. 4, a sample-hold control gate is employed to produce a bias current through separate circuitry (not shown) such that a current $I_{11}$ preferably equal to 100 microamps is caused to flow on lead 30 into the collector-base of Q11 whenever the sample-hold control is in the sample mode and a zero current is caused to flow whenever the control is in the hold mode. Since the current $I_{11}$ is mirrored to the collectors of Q12 and Q13 from Q11, the emitter currents of Q1 and Q3 are then set at $I_1 = I_3 = 100$ microamps whenever the sample-hold gate is in the sample mode. For a typical value of $C_E = 3$ picofarads and $I_1 = 100$ microamperes, the slew rate for the emitter node from the equation:

$$\text{slew rate} = (I_1/C_E)$$

is then 100 volts/microsecond. Thus, the slew rate of the overall amplifier, which typically will be in the 5 to 10 volts/microsecond range, will not be limited by the emitter capacitance of Q1 and Q3 so long as the amplifier is operating in the sample mode. When the mode control switches to the hold mode, the current $I_{11}$ in the circuit of FIG. 4 then becomes zero. The input bias current from the relationship:

$$I_{B1} = \frac{I_1}{\beta_1 + 1} + \frac{I_2}{(\beta_1 + 1)(\beta_2 + 1)}$$

then becomes $I_{B1} = 0.01$ microamperes, assuming typical values of $I_2 = 100$ microamperes, $\beta_1 = \beta_2 = 1000$. Thus, the desired objectives of fast slew rate in the sample mode and low input bias current in the hold mode are achieved.

The addition of the switched current sources provided by Q11, Q12 and Q13 add additional capacitance to the emitter nodes of Q1 and Q3 due to the collector capacitances of Q12 and Q13, respectively. This increased capacitance can cause serious problems in the sample and hold application. Although degradation of the slew rate is not significant, then added capacitance causes additional phase shift between the input and output of the amplifier. This phase shift is of a special importance to the small signal stability in the sample mode since the output amplifier forms a part of the minor feedback loop. For example, the feedback from the output to the supplemental changing amplifier in FIG. 2 is a minor loop which can exhibit small signal oscillations during sample acquisition if the phase shift in the output amplifier is excessive. Also, the added capacitance will degrade the performance of the output amplifier in FIG. 4 in the hold mode, since the added phase shift is related to settling time. Excessive capacitance on Q1 or Q3 emitters may thus cause the amplifier to oscillate or to settle very slowly to a final value, following a transient input.

Figure 5:
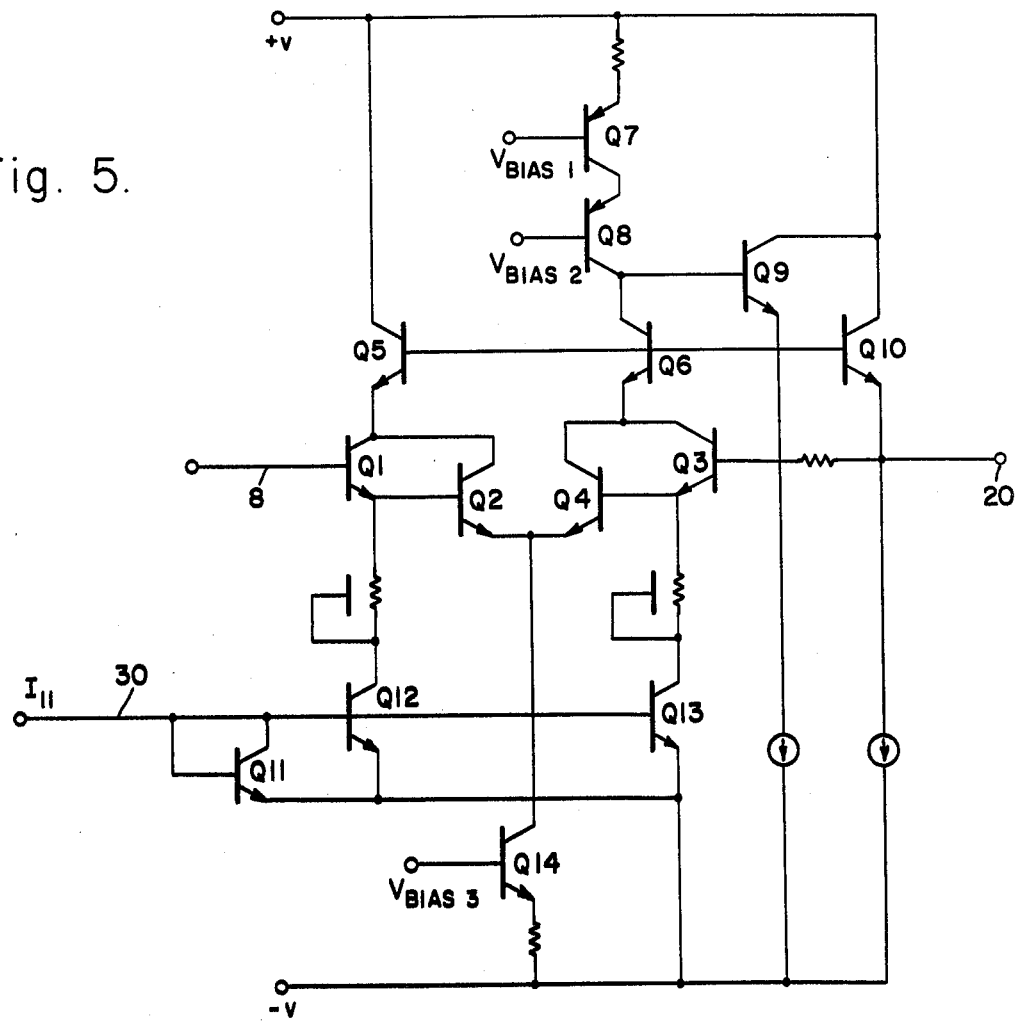
FIG. 5 is a schematic diagram of a preferred embodiment of the present invention.

Referring now to FIG. 5, the problem of excessive capacitance on Q1 or Q3 emitters is solved by placing resistors in series with Q12 and Q13 collectors. This serves the purpose of isolating the respective capacitances from the emitters of Q1 and Q3. The values of these resistors can be selected to optimize the settling time in the hold mode. The relatively large resistors required to achieve this optimization will, however, not permit the required higher currents to flow in the sample mode without saturating Q12 and Q13. This problem can be circumvented by placing a diode in parallel with each added resistor so that at higher currents the resistor drop becomes limited to approximately the 0.6 volt diode drop. An efficient implementation of the parallel diode, resistor combination for integrated circuit fabrication is the so called "pinch resistor" which is illustrated in cross-section in FIG. 6. FIG. 7 shows the standard symbol for a pinch resistor, while FIG. 8 illustrates a typical voltage current characteristic curve It is thus apparent that the circuit illustrated in FIG. 5 takes advantage of the non-linear characteristics of the pinch resistors R1 and R2 to allow optimum compensation of the amplifier during the hold mode and yet allow enhanced slewing in the sample mode.

Figure 9:
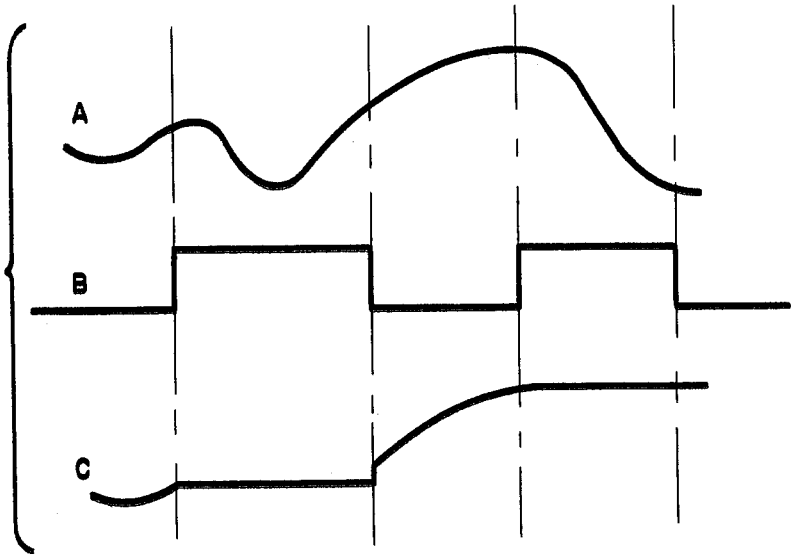
FIG. 9 is a waveform versus time diagram showing an input signal waveform, a sample and hold control gate signal and the resultant output signal.

Referring finally to FIG. 9, an output from an ideal sample and hold circuit is illustrated. Curve A shows an input signal having a random waveshape. Curve B illustrates the timing during which a sample of the waveform of Curve A is acquired and the time interval during which that sample voltage is maintained. Curve C then, shows the resultant output waveshape from the exemplary ideal sample and hold circuit.

Thus there has been described a dual mode output amplifier for a sample and hold circuit exhibiting two distinct operating modes. In one, the hold mode, the amplifier characteristics are optimized for high DC impedance and settling time, while in the other, the sample or acquisition mode, the amplifier characteristics are optimized for best slew rate and transient performance. These two distinct operating modes are normally controlled by a sample/ hold gate.

It is pointed out that although the present invention has been shown and described with reference to particular embodiment, nevertheless various changes and modifications obvious to one skilled in the art to which the invention pertains are deemed to lie within the purview of the invention.

What is claimed is:

1. An output amplifier for a sample and hold circuit having at least two distinct operative modes including a sample mode and a hold mode and thereby defining different slew rates and input bias currents comprising:
   means for receiving a first input signal that may have a random waveshape;
   means for receiving a second input signal having at least two distinct levels, one high and defining thereby a sample mode and one low, defining thereby a hold mode;
   means for mirroring said second input signal current to selected emitter node elements of the amplifier capable of influencing the slew rate thereof;
   means for changing the response characteristics of said amplifier in response to said mirrored second input signal current so as to conform the amplifier to one of said at least two distinct operative modes.

2. The amplifier of claim 1, wherein said high second input signal current level is effective to cause the slew rate of said emitter node to be at least an order of magnitude greater than the slew rate of the overall amplifier.

3. The amplifier of claim 2, wherein said sample mode is characterized by a slew rate of the amplifier of at least twice the slew rate obtained when the amplifier is in the hold mode.

4. The amplifier of claim 1, wherein said low second input signal current level is effective to cause the input bias current of said amplifier to become no more than an order of magnitude greater than its value when said amplifier is in the sample mode.

5. An output amplifier for a sample and hold circuit having at least two distinct operative modes including a sample mode and a hold mode and thereby defining different slew rates and input bias currents, comprising:
   means for receiving a first input signal that may have a random waveshape;
   means for receiving a second input signal having at least two distinct levels, one high and defining thereby a sample mode and one low, defining thereby a hold mode;

means for mirroring said second input signal current to selected emitter node elements of the amplifier capable of influencing the slew rate thereof;

non-linear resistance means for changing the response characteristics of said amplifier in response to requirements of an applicable operative mode.

6. The amplifier to claim 5, wherein said high second input signal current level is effective to cause the amplifier to assume the sample mode.

7. The amplifier of claim 6, wherein said sample mode is characterized by a slew rate of at least an order of magnitude greater than the hold mode.

8. The amplifier of claim 5, wherein said low second input signal current level is effective to cause the amplifier to assume the hold mode.

9. The amplifier of claim 8, wherein said hold mode is characterized by an input bias current no more than an order of magnitude greater than that obtained in the sample mode.

10. The method of processing signals in an amplifier for a sample and hold circuit comprising the steps of:

receiving a first input signal that may have a random waveshape;

receiving a second input signal having at least two distinct levels;

defining high and low signal levels of said second input signal;

defining a sample mode related to the high signal level of said second input signal;

defining a hold mode related to the low signal level of said second input signal;

mirroring said second input signal current to selected emitter node elements in said amplifier;

controlling the overall slew rate of said amplifier in response to said mirrored second input signal current;

changing the input bias current of said amplifier in response to said mirrored second input signal current;

changing response characteristics of said amplifier in response to said second input signal in response to the requirements of the sample and hold circuit.

* * * * *